United States Patent [19]

Temple

[11] Patent Number: 4,980,741
[45] Date of Patent: Dec. 25, 1990

[54] MOS PROTECTION DEVICE

[75] Inventor: Victor A. K. Temple, Jonesville, N.Y.

[73] Assignee: General Electric Company, Schenectady, N.Y.

[21] Appl. No.: 308,498

[22] Filed: Feb. 10, 1989

[51] Int. Cl.$^5$ .............................................. H01L 29/74
[52] U.S. Cl. ...................................... 357/38; 357/39; 357/23.4; 357/23.13
[58] Field of Search ................ 357/38, 39, 23.4, 23.13

[56] References Cited

U.S. PATENT DOCUMENTS

| | | | |
|---|---|---|---|
| 4,484,244 | 11/1984 | Avery | 361/91 |
| 4,546,401 | 10/1985 | Svedberg | 361/91 |
| 4,630,084 | 12/1986 | Tihanyi | 357/38 |
| 4,686,602 | 8/1987 | Bucksch | 361/91 |
| 4,694,315 | 9/1987 | Svedberg | 357/23.13 |
| 4,831,424 | 5/1989 | Yoshida et al. | 357/23.4 |

FOREIGN PATENT DOCUMENTS

| | | | |
|---|---|---|---|
| 57-190359 | 11/1982 | Japan | 357/23.13 |
| 60-142565 | 7/1985 | Japan | 357/23.13 |
| 60-249367 | 12/1985 | Japan | 357/23.4 |
| 62-62559 | 3/1987 | Japan | 357/23.13 |
| 1-22067 | 1/1989 | Japan | 357/23.4 |

Primary Examiner—Rolf Hille
Assistant Examiner—Steven Loke
Attorney, Agent, or Firm—Marvin Snyder; James C. Davis, Jr.

[57] ABSTRACT

An MOS device, for self-protection from overvoltages and for protection of another circuit or component in some applications, has a semiconductor substrate which includes a drain region with a plurality of base regions disposed therein. Source regions are diffused into at least one of the base regions; at least one base region does not require any source regions and defines a sourceless base region. A diode junction, formed between the sourceless base region and the abutting drain region, undergoes junction breakdown at an avalanche voltage level chosen to cause voltage breakdown to occur between a second electrode and a gate electrode at a lower voltage level than a breakdown voltage level present between the second electrode and the first electrode when the chosen avalanche level is exceeded by a voltage applied to the device or the protected component. A gate electrode contacts the sourceless base region to cause any avalanche current to be conducted to the gate electrode when the chosen avalanche voltage level is exceeded, to enhance a channel between the source region and the drain region to provide a uniform and controlled alternate path for the further device current other than the avalanche current.

18 Claims, 7 Drawing Sheets

MOS PROTECTION DEVICE

BACKGROUND OF THE INVENTION

The present invention relates to metal-oxide-semiconductor (MOS) devices and, more particularly, to a self-protected metal-oxide-semiconductor (MOS) device for safely conducting current when the MOS device's avalanche voltage is exceeded and for protecting other devices, without self-protection capability, from overvoltage which could cause failure of those other devices.

An electronic circuit component may be damaged or destroyed by an overvoltage and the resulting excessively large current resulting therefrom. Various devices and circuits have been employed in the past to protect circuit components by limiting the voltage across the component and/or by providing the large current with an electrical path away from or around the protected component. A typical prior art protection circuit utilizes a discrete thyristor, connected in parallel with the protected component, to provide a bypass path for the excess current. While a thyristor, depending upon its size, has the capacity to conduct large currents, a disadvantage associated with its use is the inherent time delay required before a sufficient threshold charge is developed across the gate-cathode PN junction of the thyristor, so that significant damage can occur to the protected component before conduction occurs in the thyristor. A thyristor also exhibits regenerative characteristics upon switching to a conducting state and may remain conductive after the transient has ended, thereby affecting the normal operation of the protected component.

Other known types of component-protection devices have included diodes, bipolar transistors or combinations thereof. Protection devices of these types can act faster than a thyristor, but generally do not have the requisite current-carrying capacity for dissipation of the power. Therefore, these devices may not be reliable over a long service period and are susceptible to damage both by a large transient voltage and by the resulting larger circuit current.

It is accordingly a primary object of the present invention to provide a novel self-protected MOS device which is not subject to the foregoing disadvantages.

It is another object of the present invention to provide a novel MOS protection device for protecting itself and another component from overvoltage, with the novel device having a fast response time, a capability of conducting an excessively large resulting current and high reliability over a long service life.

A further object of the present invention is to provide a novel semiconductor device for overvoltage protection of a component which does not adversely affect the normal operation of the component.

Still another object of the present invention is to provide a novel semiconductor device for overvoltage protection, which device is simple in construction and inexpensive to manufacture.

These and other objects of the invention together with the features and advantages thereof will become apparent from the following detailed specification when read with the accompanying drawings in which like reference numerals refer to like elements.

SUMMARY OF THE INVENTION

In accordance with the invention, an MOS device, used for overvoltage self-protection and in some applications for protection of a protected component or circuit, comprises a semiconductor substrate which includes a drain region of a first conductivity type The drain region terminates in a substrate contact surface. A plurality of base regions of a second conductivity type are disposed in the drain region. Source regions are diffused into the plurality of base regions with at least one base region not needing any source regions diffused into it, to define a sourceless base region. A first electrode and a second electrode, for connection to the protected component, are respectively in electrical contact with the source regions and the drain region; a gate electrode is in electrical contact with the sourceless base region. A diode junction, formed between the sourceless base region and the abutting drain region, undergoes junction breakdown at an avalanche voltage level chosen to cause voltage breakdown to occur between the second electrode and the gate electrode at a lower voltage level than a breakdown voltage level present between the second electrode and the first electrode when the chosen avalanche voltage level is exceeded by a voltage applied to the device or the protected component. The resulting avalanche current is conducted to the gate electrode and causes a potential difference between the source and gate electrodes to cause the device to partly turn-on, providing a uniform and controlled alternate device current path, between the first and second electrodes, for the further device current other than the avalanche current. The avalanche current flowing through the sourceless base region is limited by resistive means, capacitive means or a combination of both, connected between the gate electrode and the first electrode, preventing avalanche destruction of the sourceless base region.

In an alternate embodiment, a wide-base transistor (WBT), an insulated gate bipolar transistor (IGBT) and a thyristor are all formed in the substrate, in parallel connection with the protected component. The WBT undergoes avalanche breakdown at an avalanche voltage level chosen to be less than the breakdown voltage level of both the IGBT and the thyristor when the chosen avalanche voltage level is exceeded by a voltage applied to the device or the protected component. The resulting avalanche current from avalanche breakdown of the WBT is conducted to the gate electrode of the IGBT to cause the device to partly turn-on, providing a first uniform and controlled alternate current path, between the first and second electrodes, for the further device current. The thyristor operates as a crowbar device when there is too much energy for the IGBT to dissipate by providing a second controlled alternate device current path between the first and second electrodes when a sufficiently high current from the IGBT exceeds the thyristor gate drive current threshold and turns the thyristor on.

DETAILED DESCRIPTION OF THE PREFERRED EMBODIMENTS

Figure 1:
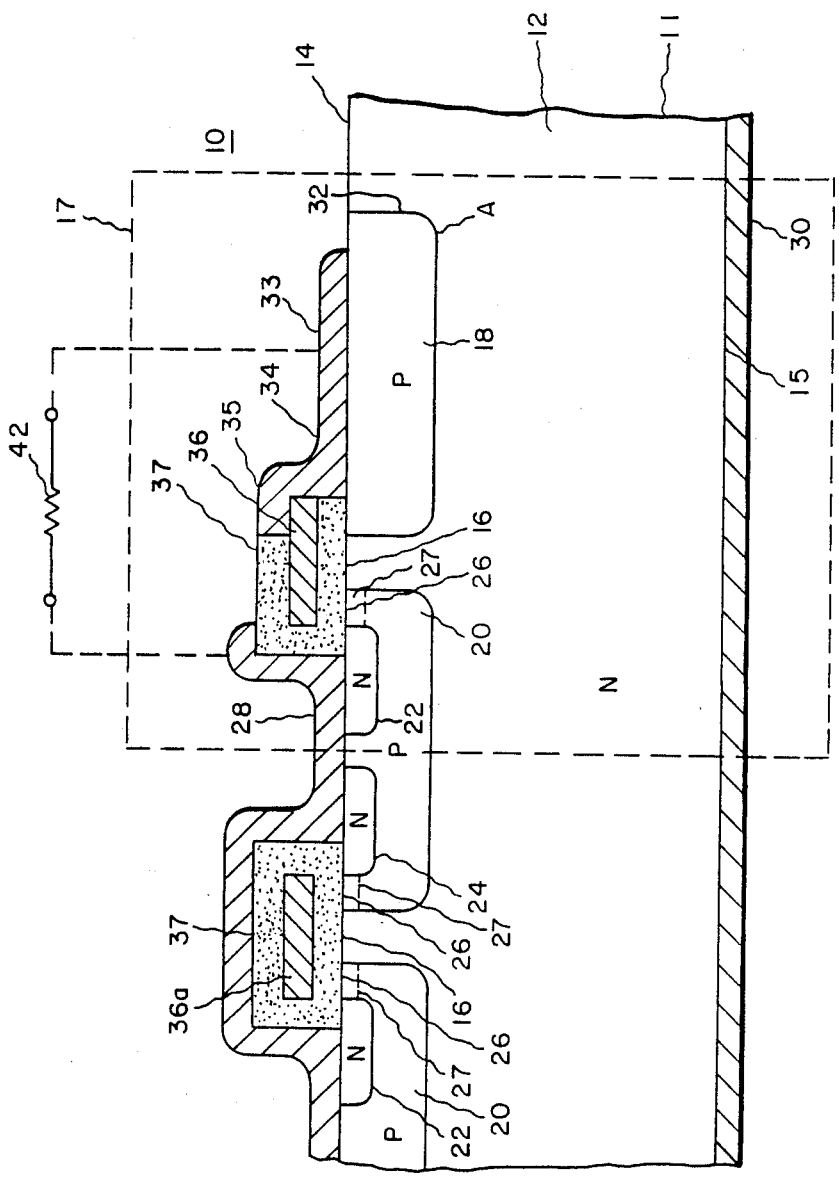
FIG. 1 is a cross-sectional view of one embodiment of a semiconductor device in accordance with the present invention.

Referring now to FIG. 1 a first presently preferred device 10, in accordance with the present invention, comprises a plurality of cells formed in a semiconductor substrate 11, preferably of silicon. Substrate 11 has a principal substrate surface 14 opposite to a substrate contact surface 15, and has a drain region 12 of a first conductivity type (e.g N type) therebetween. A plurality of base regions 18 and 20 of a second conductivity type (e.g. P type) are diffused into N type drain region 12 with a lateral spacing from each other, along principal substrate surface 14, sufficient to provide an intermediate portion 16 of drain region 12 therebetween. One cell 17 (enclosed in a dashed line) of the plurality of cells may have a sourceless base region 18, i e. a base region that does not need source regions diffused into it although it may without affecting device operation. Also sourceless base region 18 is electrically isolated from other base regions 20. Each of the other base regions 20 has at least a first source region 22 and a second source region 24, both of the first (e.g. N) conductivity type, diffused into it. First source region 22 and second source region 24 are spaced from each other along principal substrate surface 14. Source regions 22 and 24 are each located at a predetermined spacing from intermediate drain region portion 16, so as to provide a boundary portion 26 of sourced base region 20 therebetween. A first electrode 28 is in electrical contact with portions of sourced base region 20, first source region 22 and second source region 24, at principal surface 14. A second electrode 30 is in electrical contact with drain region 12 at substrate contact surface 15. Electrodes 28 and 30 may provide connections to an external protected component 100 as shown in FIGS. 3 and 4.

A diode junction 32 is formed at the boundary between sourceless base region 18 and drain region 12, with a junction breakdown, or avalanche, voltage level chosen to cause voltage breakdown to occur between second electrode 30 and gate electrode 36 at a lower voltage level than a breakdown voltage level present between second electrode 30 and first electrode 28 when the chosen avalanche voltage level is exceeded by a voltage applied to device 10 or to component 100 to be protected. A first section 33, of a gate electrode 34, is in electrical contact with sourceless base region 18 at principal surface 14. Another section 35 of this electrode is in contact with a gate 36. Gate 36 is spaced from principal surface 14 by a layer 37 of passivation material which substantially completely surrounds gate 36 except where gate 36 is contacted by gate electrode section 35. Gate 36 overlies part of sourceless base region 18, intermediate drain region portion 16 and boundary portion 26 to define one cell 17. The other cells of the plurality of cells are each defined by an insulated gate 36a overlying all of adjacent base region boundary portions 26 and a different associated intermediate drain region portion 16 therebetween.

Figure 3:
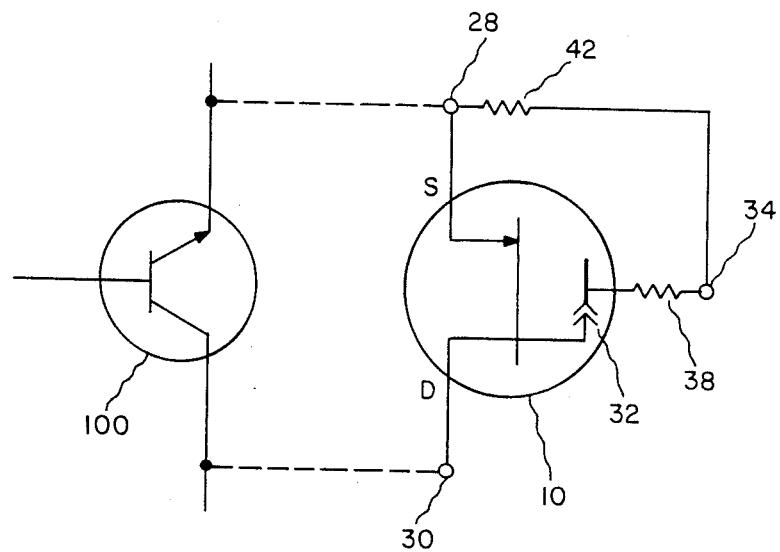
FIG. 3 illustrates the equivalent circuit of the embodiments shown in FIGS. 1 and 2, with external resistors.
Figure 4:
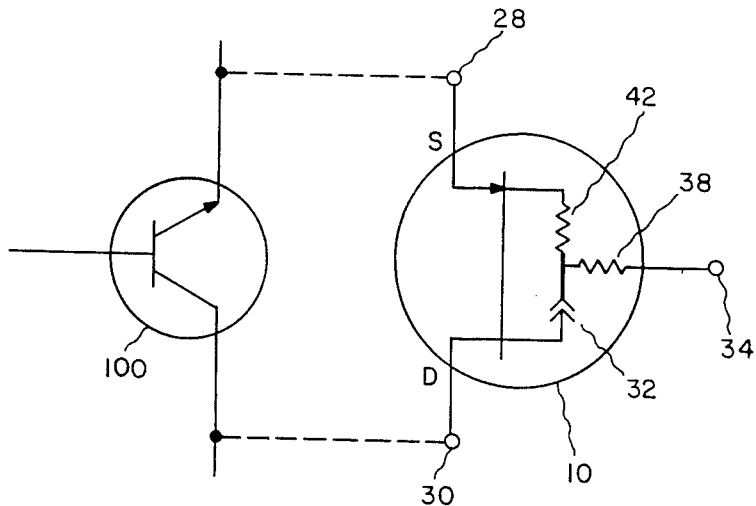
FIG. 4 illustrates the equivalent circuit of the embodiments shown in FIGS. 1A and 2, with built-in resistors.

In operation, device 10 may be connected, as shown in FIGS. 3 or 4, across protected component 100 by means of first electrode 28 and second electrode 30. If protected component 100 receives a voltage that exceeds the chosen avalanche voltage level of diode junction 32, then junction 32 will break down at a selected location along its length and the avalanche current resulting from the applied transient flows from electrode 30, through substrate 11 and region 18 to be conducted to gate electrode 34 to turn-on device 10. Channels 27 (shown bounded by a dashed line and by principal substrate surface 14 in FIG. 1) are enhanced across boundary portion 26 responsive to a gate-source voltage increase due to charge added to the device gate-source capacitance when avalanche current flows into gate electrode 34. Channels 27 provide uniform and controlled alternate current paths between first electrode 28 and second electrode 30, for the further device current other than the avalanche current, to dissipate the excess energy and protect device 10 and component 100 from damage. The voltage across device 10 will be clamped at the chosen avalanche voltage level of diode junction 32.

In accordance with the present invention, the breakdown voltage of junction 32 must be lower than any other junction in the device in order that junction 32 will break down first to conduct the resulting avalanche current to gate electrode 34. Methods for controlling the breakdown voltage of a PN junction to yield avalanche breakdown at a desired voltage level are well known by those persons skilled in the art. One method that may be used in conjuction with the present invention, to cause junction 32 to breakdown near location A at a chosen avalanche voltage level, is controlling the radius of curvature of the corners of junction 32. Additionally, base region 18 may be located proximate to an outer edge of device 10 since it is well known in the art that junctions near the device edges usually break down at lower voltages than junctions nearer the device interior If, however, the breakdown voltage of junction 32 is lower than desired, the junction breakdown voltage may be increased to a specific percentage of the breakdown voltage of the interior junctions by methods known in the art such as junction termination extensions, floating field rings or field plates.

Figure 1A:
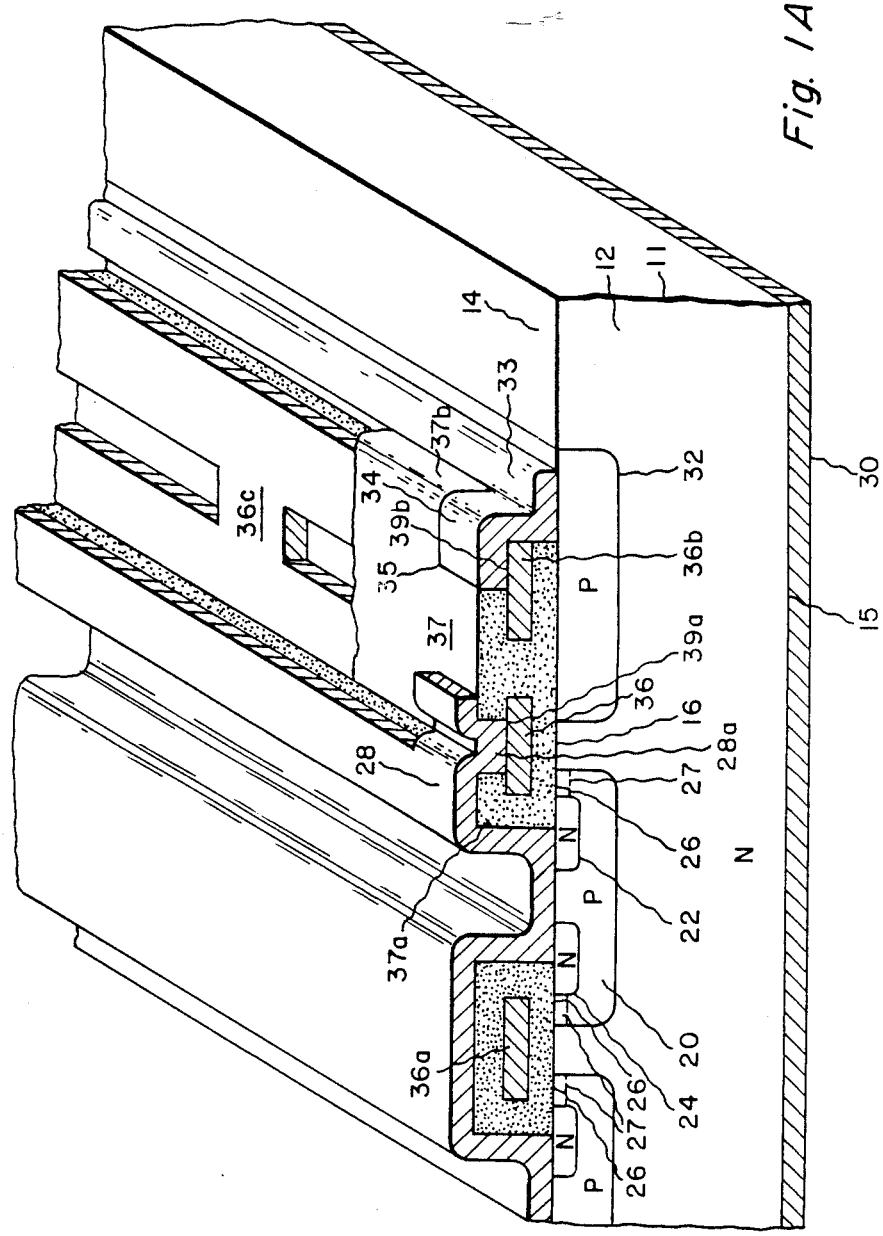
FIG. 1A is a perspective view of a second embodiment of a device in accordance with the present invention.

An impedance (shown as an external resistor 42 in FIG. 3, although an external capacitor may be used as well) may be provided between first electrode 28 and gate electrode 34 to limit the magnitude of the resulting avalanche current when junction 32 breaks down to prevent avalanche destruction of base region 18. Resistor 42 may also be selected to limit the leakage current to an acceptable level to prevent premature device turn-on. During normal operation of device 10, leakage current can flow between first electrode 28 and gate electrode 34. This leakage current can charge the device gate-source capacitance to a sufficient level where the device threshold turn-on voltage is exceeded, resulting in the device becoming conductive prematurely. It is desirable that resistor 42 be large for reducing the magnitude of the avalanche current but also small to limit the leakage current to acceptable levels. Resistor 42 may be as low as 10 ohms, but normally is greater than 100 ohms and may be greater than 1000 ohms in some applications depending upon the device turn-on voltage Resistor 42 will also facilitate rapid depletion of charge stored in the gate capacitance, to assure that device 10 rapidly becomes nonconducting after the overvoltage has subsided, so that normal operation of the protected component can resume Resistance 42 can either take the form of an external discrete component, as shown in FIG. 3 and FIG. 1, or can be incorporated in device 10, as shown in FIG. 4 and FIG. 1A. If the latter, referring to FIG. 1A, resistance 42 may be incorporated in the polysilicon material of gate 36, gate portion 36b, and gate portion 36c interconnecting gate 36 and gate portion 36b. A window 39a is formed in one section 37a of passivation layer 37 above gate 36 into which first electrode portion 28a is deposited in electrical contact with gate 36 and another window 39b is formed in another section 37b of passivation layer 37 into which gate electrode section 35 is deposited in electrical contact with gate portion 36b. Part of the function of resistor 42 may be performed by an internal gate resistance 38 shown in FIGS. 3 and 4.

Figure 2:
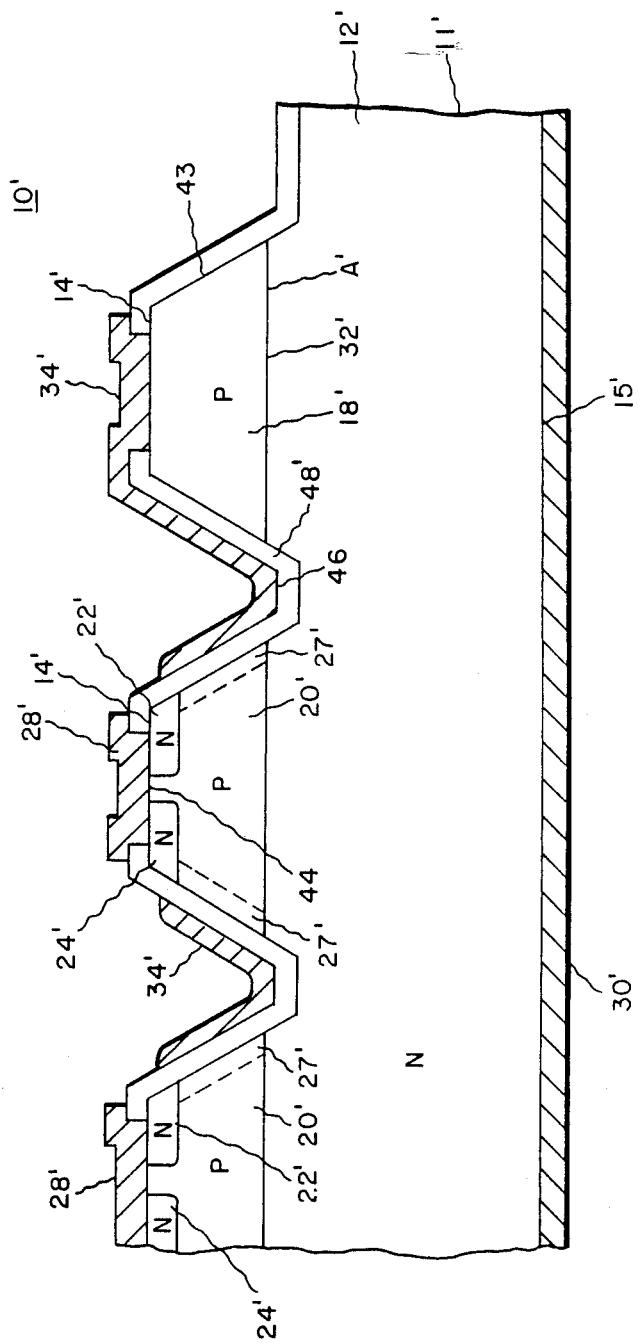
FIG. 2 is a cross-sectional view of a third embodiment of a device in accordance with the present invention.

A second presently preferred embodiment, in accordance with the present invention, is the device 10' shown in FIG. 2. Device 10' has a vertical-metal-oxide semiconductor (VMOS) structure. A layer 43 of base material of P-type conductivity is disposed upon the surface of the N-type drain region 12'. Drain region 12' terminates in contact surface 15' on which second electrode 30' is disposed. The base material layer 43 is divided into separate base regions by parallel, substantially V-shaped, flat bottomed grooves (such as V groove 46) each reaching from principal surface 14' into drain region 12'. The separate base regions include at least one sourceless base region 18' and at least one sourced base region 20'. First source region 22' and second source region 24', both of N-type conductivity, are each diffused into sourced base region 20' at principal surface 14' and with a lateral spacing along surface 14' from each other sufficient to provide an intermediate portion 44 of sourced base region 20' therebetween. First electrode 28' is in contact, at principal surface 14', with first and second source regions 22' and 24' and with intermediate base region portion 44 Gate electrode 34' is in contact with sourceless base region 18' and extends into groove 46 between sourceless base region 18' and sourced base region 20'. Gate electrode 34' overlies an area including part of sourceless base region 18', drain region 12' and first base region 20' up to at least first source region 22'. Gate electrode 34' is separated from the area just described by a layer 48' of passivation material As in the embodiment of FIG. 1, a diode junction 32' is located between sourceless base region 18' and drain region 12' and is formed to undergo junction breakdown at an avalanche voltage level chosen to cause voltage breakdown to occur between second electrode 30' and gate electrode 34' at a lower voltage level than a breakdown voltage level present between second electrode 30' and first electrode 28' when the chosen avalanche level is exceeded by a voltage applied to device 10 or protected component 100. Therefore, as previously described, when the transient voltage exceeds the chosen avalanche voltage level, the resulting avalanche current is conducted to each first gate electrode 34' and channels 27' are enhanced across each base region 20' between drain region 12' and first and second source regions 22' and 24' to provide uniform and controlled alternate current paths between first electrode 28 and second electrode 30 for the remaining device current other than the avalanche current, to dissipate the excess energy and protect device 10 or component 100 from damage.

As with the embodiment of FIG. 1, junction 32' should have a lower breakdown voltage than any other junction in device 10'. It is known in the art that the V-etch will cause a lower breakdown voltage to occur at the edge termination of a base region; therefore, base region 18' will have the lowest breakdown voltage near location A' where the concentration of field lines will be greatest when a voltage is applied to device 10'. Also, region 18' may be located near the edge of device 10' to further reduce the breakdown voltage as previously discussed and other known methods such as floating field rings or field plates may be used to some degree to increase the breakdown voltage of junction 32' if it is desired that the junction 32' breakdown voltage be a chosen percentage of the breakdown voltage of an interior junction.

Figure 5:
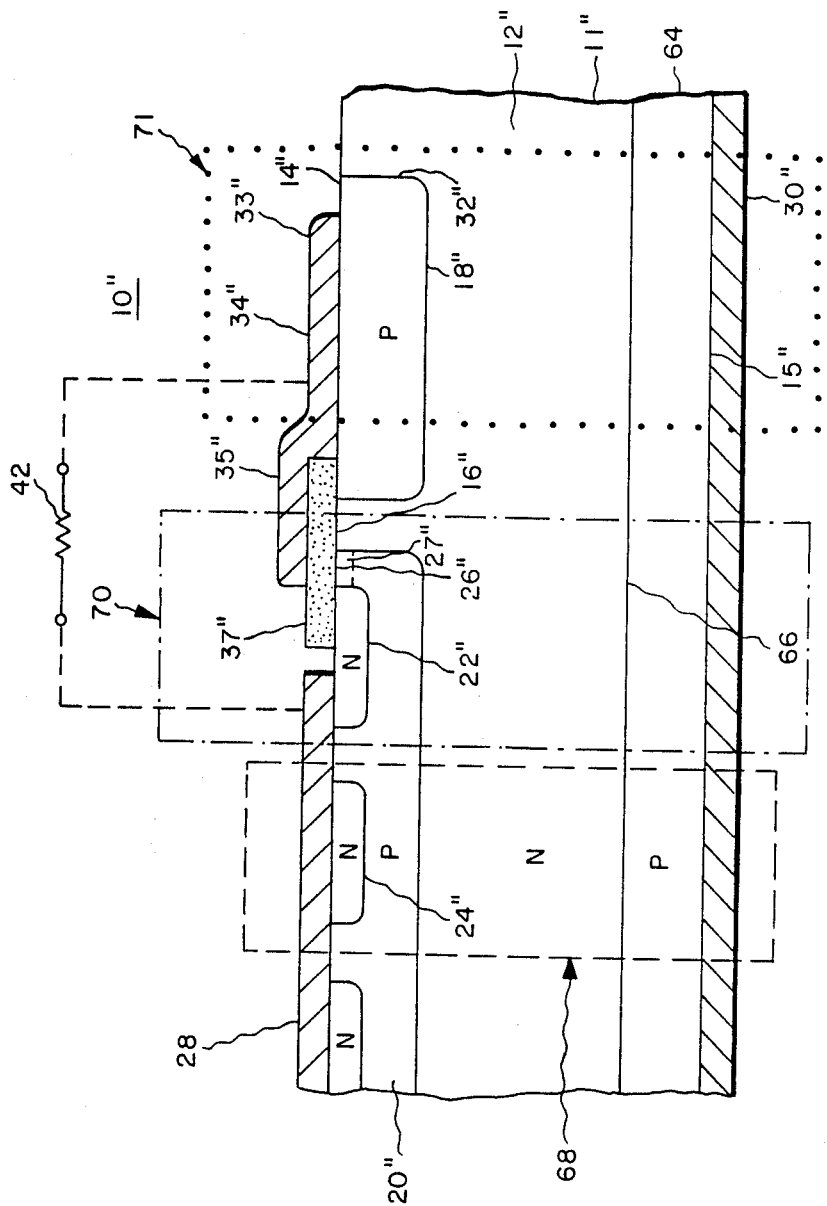
FIG. 5 is a cross-sectional view of a further embodiment of a semiconductor device in accordance with the present invention.

Another presently preferred embodiment of the present invention is a device 10" as shown in FIG. 5. An intermediate semiconductor region 64 of a second conductivity type (e g. P-type conductivity) is disposed between drain region 12" and second electrode 30", the latter constituting an anode in electrical contact with substrate contact surface 15". A second diode junction 66 is located between intermediate region 64 and drain region 12". Portion 33" of gate electrode 34" is in contact with sourceless base region 18" at principal surface 14", while gate electrode portion 35" is spaced from principal surface 14" by passivation layer 37". Portion 35" overlies part of sourceless base region 18", intermediate drain region portion 16" and boundary portion 26", up to at least first source region 22".

A thyristor 68 is shown in FIG. 5 enclosed in a dashed line. The thyristor is formed by the combination of second source region 24" and portions of sourced base region 20", drain region 12" and intermediate region 64. Thyristor 68 has a predetermined thyristor gate drive current threshold for thyristor turn-on.

An insulated gate bipolar transistor (IGBT) 70 is shown enclosed in a chain line in FIG. 5 and is formed by the combination of portion 35" of gate electrode 34", first source region 22" and portions of sourced base region 20", drain region 12" and intermediate region 64.

A wide base transistor (WBT) 71 is shown enclosed within a dotted line and is formed by the combination of portions of sourceless base region 18", drain region 12", and intermediate region 64. WBT 71 has an avalanche breakdown voltage selected to be less than the breakdown voltages of both IGBT 70 and thyristor 68.

Figure 6:
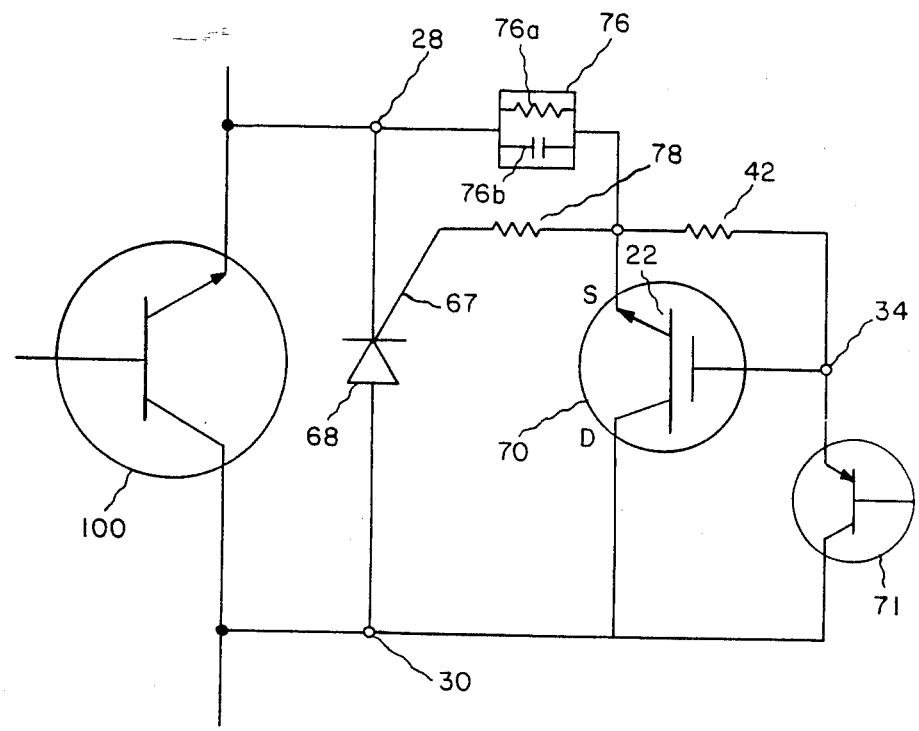
FIG. 6 illustrates the equivalent circuit of the embodiments shown in FIG. 5.

FIG. 6 illustrates the equivalent circuit of the device shown in FIG. 5. In operation, WBT 71 will break down when an overvoltage applied to protected component 100 exceeds the avalanche voltage level of WBT 71 to allow the resulting avalanche current to flow into gate electrode 34" of IGBT 70. The resulting avalanche current flowing into gate electrode 34" causes a potential difference between the source and gate of IGBT 70 to enhance a channel 27", shown bounded by a dashed line and by principal substrate surface 14" in FIG. 5, across boundary portion 26" to permit IGBT 70 to conduct. IGBT 70 provides a first uniform and controlled alternate current path between second electrode 30 and first electrode 28, for the remaining device current flowing other than the avalanche current and clamps the voltage between electrodes 28 and 30 at a level determined by resistor 42.

Thyristor 68 is connected such that a gate drive current, applied to thyristor gate 67, is a function of the remaining device current conducted by IGBT 70 If the applied voltage is sufficiently large so that the magnitude of the thyristor gate drive current exceeds the predetermined thyristor gate turn-on drive current threshold, the thyristor will become conductive to operate as a crowbar, to remove the overvoltage stress from protected component 100 by providing a second controlled alternate device current path between second electrode 30 and first electrode 28, to dissipate excess energy and protect device 10″ and component 100 from damage Thus, the clamping action of WBT 71 and IGBT 70 will protect component 100 from small overvoltages, but whenever a large applied voltage results in a large device current, thyristor 68 will be switched to a conducting state and will serve as an alternate device current path.

The magnitude and waveform shape of the gate drive current applied to thyristor 68, which determines whether the thyristor will become conductive, is controlled by a control means 76. Control means 76 includes a series resistor 76a coupled between first source region 22 of IGBT 70 and first electrode 28. A capacitor 76b may be connected in parallel with resistor 76a.

Alternatively, or in addition, a further resistor 78 may be coupled between source region 22 and gate 67 of thyristor 68 to limit the magnitude of applied thyristor gate drive current. The resistance/capacitive network of control means 76 allows better control of whether thyristor 68 will operate under different conditions of A.C. or D.C. overload. For example, with a D.C. voltage overload of a very short duration, thyristor turn-on may not be desirable In this situation current can bypass thyristor gate 67 through capacitor 76b.

Figure 7:
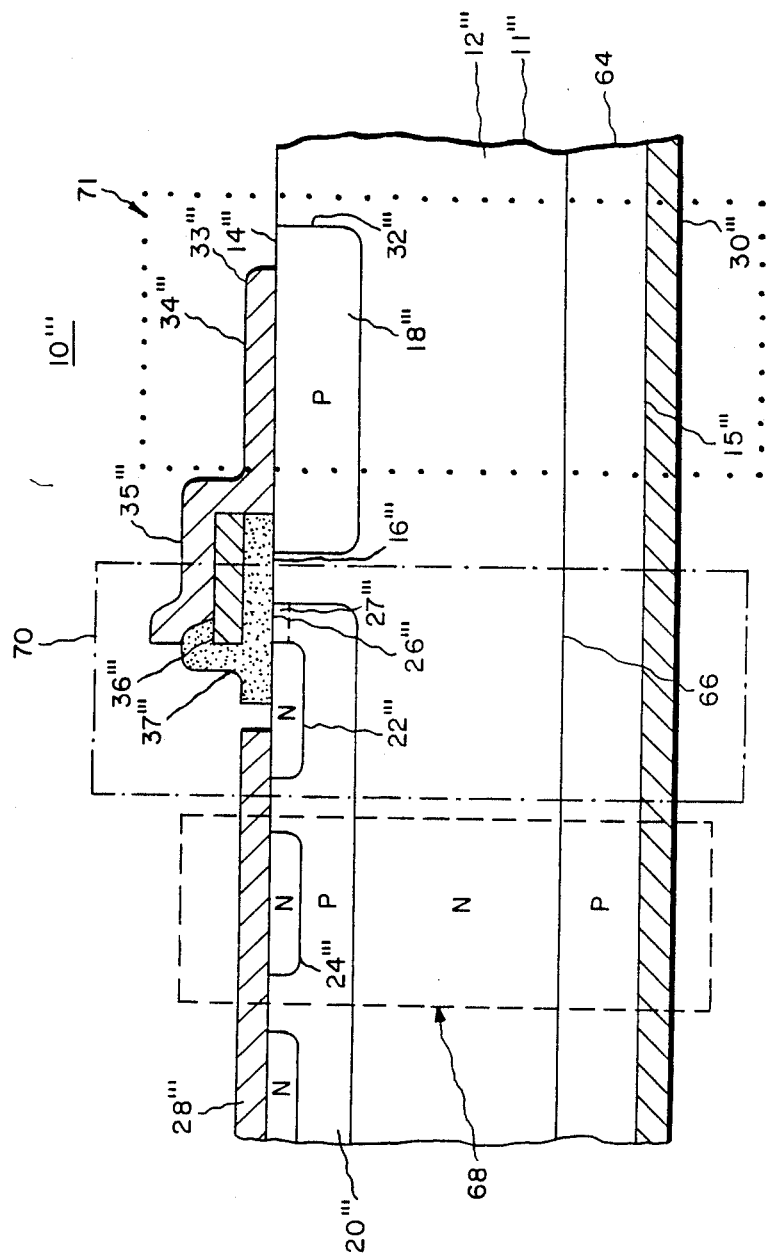
FIG. 7 is a cross-sectional view of still another embodiment of a semiconductor device in accordance with the present invention.

The resistor 42 may also be provided between first electrode 28 and gate electrode 34 to prevent premature turn-on of transistor 70 due to leakage current and to limit the avalanche current, as previously described with regard to the embodiments in FIGS. 1 and 1A, and to facilitate turn-off of the device after the applied overvoltage has subsided. Resistor 42 may be an external, discrete component as shown in FIGS. 5 and 6, or resistor 42 may be built-into a polysilicon gate 36‴ as shown in FIG. 7, similar to the embodiment shown in FIG. 1A.

It will be readily understood by those skilled in the art that the present invention is not limited to the specific embodiments described and illustrated herein. Different embodiments and adaptations besides those herein shown and described, as well as many variations, modifications and equivalent arrangements will now be apparent or will be reasonably suggested by the foregoing specification and drawings, without departing from the substance or scope of the invention. Accordingly, it is intended that the invention be limited only by the spirit and scope of the claims appended hereto.

What is claimed is:

1. An MOS device for self-protection from overvoltage, comprising:
   a drain region of a first conductivity type;
   a plurality of base regions of a second conductivity type, formed in said drain region;
   at least one source region, of said first conductivity type, formed in at least one of said base regions, each of said at least one source region being located with a preselected spacing from said drain region;
   a first electrode and a second electrode for making electrical connection to said device, said first electrode region and said at least one base region, and said second electrode in electrical contact with said drain region;
   a gate electrode in direct electrical contact with a base region electrically isolated from said at least one base region contacted by said first electrode; and
   a diode junction formed between said electrically isolated base region and said drain region, said junction having an avalanche voltage level chosen to cause voltage breakdown to occur between said second electrode and said gate electrode at a lower voltage level than a breakdown voltage level present between said second electrode and said first electrode when said chosen avalanche voltage level is exceeded, so as to cause a resulting avalanche current to be conducted to said gate electrode when said chosen avalanche voltage is exceeded and to cause further device current to be conducted through at least one uniform and controlled alternate current path formed between said first and second electrodes:
   said device further comprising impedance means coupled between said gate and first electrodes for controlling the magnitude of said avalanche current and for preventing said device from becoming prematurely conductive due to an allowable leakage current.

2. The device of claim 1, wherein said impedance means is a resistor built into a polysilicon gate of the device.

3. The device of claim 1, wherein said impedance means comprises at least one of a resistor and a capacitor, externally connected to said device.

4. The device of claim 1, wherein said impedance means has a resistance greater than 10 ohms 5. The device of claim 1, wherein said impedance means has a resistance greater than 1000 ohms.

6. The device of claim 1, wherein said first electrode and said second electrode are electrically connectable for protection of an external circuit by said device.

7. The device of claim 1, wherein said electrically isolated base region is located proximate to an outer edge of the MOS device to cause said diode junction to breakdown at said lower voltage level than said breakdown voltage level present between said second electrode and said first electrode when said chosen avalanche voltage level is exceeded.

8. The device of claim 1, wherein said electrically isolated base region has a radius of curvature selected to cause said diode junction to breakdown at said lower voltage level than said breakdown voltage level present between said second electrode and said first electrode when said chosen avalanche voltage level is exceeded.

9. The device of claim 1, further comprising:
   at least a second source region formed in said at least one base region with a selected spacing from said first source region; and
   an intermediate region of said second conductivity type disposed between said drain region and said second electrode, and in electrical contact with said second electrode;
   a combination of said intermediate region, said drain region and said separate base region forming a widebase transistor having an avalanche breakdown voltage level;

a combination of said intermediate region, said drain region, said at least one base region, said first source region and said gate electrode, insulatively spaced from the aforesaid regions by a layer of passivation material, forming an insulated gate bipolar transistor having a transistor breakdown voltage level greater than said wide-base transistor avalanche voltage level, and providing a first uniform and controlled alternate current path between said first and second electrodes for a further device current to protect said device when said wide-base transistor avalanche voltage level is exceeded;

a combination of said intermediate region, said drain region, said at least one base region and said second source region forming a thyristor having a gate and a predetermined gate drive current threshold for thyristor turn-on, and providing a second uniform and controlled alternate device current path between said first and second electrodes when said predetermined gate drive current threshold is exceeded.

10. The device of claim 9, wherein a resulting avalanche current is conducted to said gate electrode when said wide-base transistor avalanche voltage level is exceeded, and said device further comprises impedance means coupled between said gate and first electrodes for reducing the magnitude of said avalanche current and for preventing said device from becoming prematurely conductive due to an allowable leakage current.

11. The device of claim 10, wherein said impedance means is a resistance of a polysilicon gate of the device.

12. The device of claim 10, wherein said impedance means has a resistance greater than 10 ohms.

13. The device of claim 10, wherein said impedance means has a resistance greater than 1000 ohms.

14. The device of claim 10, wherein said impedance means comprises at least one of a resistor and a capacitor, externally connected to said device.

15. The device of claim 9, further comprising control means coupled between said insulated gate transistor and said thyristor for diverting a portion of the first path further device current to cause said thyristor to become conductive and provide said second device current path when the diverted current exceeds said predetermined gate drive current threshold.

16. The device of claim 15, wherein said control means comprises at least one of a resistor and a capacitor.

17. The device of claim 9, wherein said first electrode and said second electrode are electrically connectable for protection of an external circuit by said device.

18. The device of claim 1, further comprising at least one groove separating said at least one base region and said another base region.

* * * * *